United States Patent
Yamazaki

[11] Patent Number: 6,002,161
[45] Date of Patent: Dec. 14, 1999

[54] SEMICONDUCTOR DEVICE HAVING INDUCTOR ELEMENT MADE OF FIRST CONDUCTIVE LAYER OF SPIRAL CONFIGURATION ELECTRICALLY CONNECTED TO SECOND CONDUCTIVE LAYER OF INSULAR CONFIGURATION

[75] Inventor: Toru Yamazaki, Tokyo, Japan

[73] Assignee: NEC Corporation, Tokyo, Japan

[21] Appl. No.: 08/756,536

[22] Filed: Nov. 26, 1996

[30] Foreign Application Priority Data

Dec. 27, 1995 [JP] Japan ..................... 7-341515

[51] Int. Cl.⁶ .................. H01L 29/00; H01L 21/331; H01F 5/00
[52] U.S. Cl. .................. 257/531; 336/200; 438/381
[58] Field of Search .................. 257/531; 438/381; 336/200

[56] References Cited

U.S. PATENT DOCUMENTS 4,959,631  9/1990  Hasegawa et al. ............ 336/200
5,384,274  1/1995  Kanehachi .................... 437/47
5,610,433  3/1997  Merrill et al. ................ 257/531
5,793,272  8/1998  Burghartz et al. ............ 336/200

FOREIGN PATENT DOCUMENTS

61-144052  7/1986  Japan .
3-263366   11/1991 Japan .

*Primary Examiner*—Brian Dutton
*Attorney, Agent, or Firm*—Foley & Lardner

[57] ABSTRACT

The semiconductor device includes an inductor element which includes a first conductive film pattern of a spiral configuration formed on a major face of a semiconductor substrate, and second conductive film patterns of an insular configuration electrically connected only to the first conductive film pattern through contact holes formed in an interlayer insulation film and extending in an overlapping relationship with the first conductive film pattern.

27 Claims, 12 Drawing Sheets

SEMICONDUCTOR DEVICE HAVING INDUCTOR ELEMENT MADE OF FIRST CONDUCTIVE LAYER OF SPIRAL CONFIGURATION ELECTRICALLY CONNECTED TO SECOND CONDUCTIVE LAYER OF INSULAR CONFIGURATION

BACKGROUND OF THE INVENTION

1. Field of the Invention

This invention relates to a semiconductor device and a method of producing the same, and more particularly to a semiconductor device wherein an inductor element is provided on a semiconductor substrate and a method of producing the semiconductor device.

2. Description of the Related Art

In an LSI in recent years, it is important to form, as internally incorporated elements, active elements such as MOS transistors and bipolar transistors as well as passive elements such as resistors, capacitors and inductors.

Particularly, as an element which constitutes a filter or a like device for use in a radio frequency band from several hundreds MHz to 1 GHz or more, an inductor L is an important element together with a capacitor C.

Figure 1:
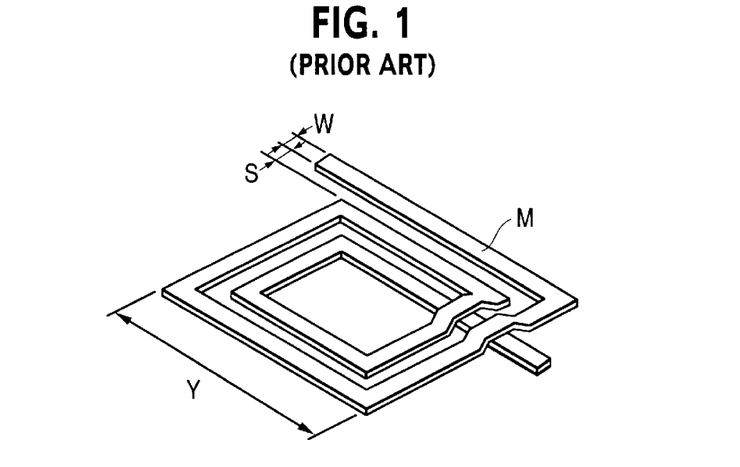
FIG. 1 is a schematic view showing a conventional spiral inductor element.
Figure 2:
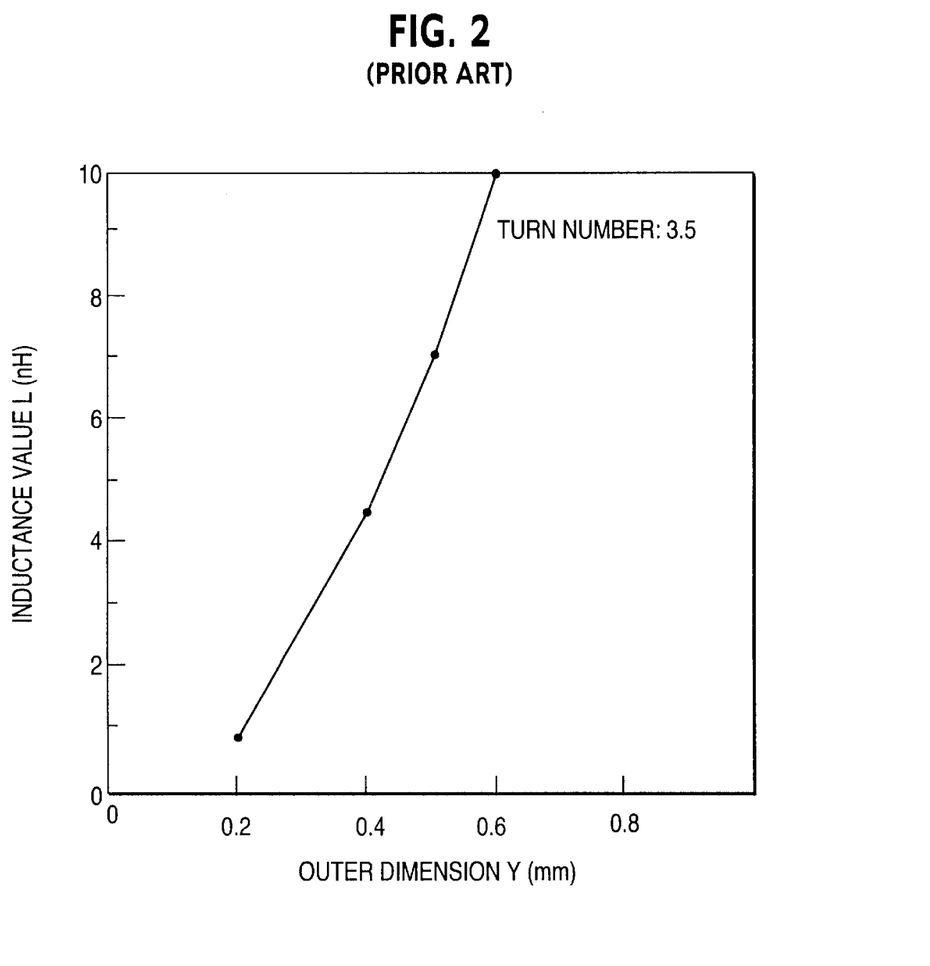
FIG. 2 is a diagram illustrating a relationship between an outer dimension and an inductance value of a spiral inductor element.

An inductor element incorporated in an LSI is conventionally formed from, as shown in FIG. 1, metal wiring M, for example, an aluminum wiring, extending spirally substantially in a plane. The inductance of the inductor element varies depending upon outer dimension Y, turn number n and wiring width W and wiring distance S. A relationship between outer dimension Y and inductance value L where, for example, W=S=20 $\mu$m and n=3.5 turns is illustrated in FIG. 2.

As one of the indices which represent the performance of the inductor described above, there is a value called Q (quality factor). It can be said that, as the quality factor Q increases, the inductance component becomes purer, that is, the inductor approaches an ideal inductor. The quality factor Q is represented, from an angular frequency $\omega$ ($\omega=2\pi f$, f: frequency), an inductance L and a wiring resistance Rm of the spiral inductor element, by the following expression:

$$Q=\omega L/Rm \qquad \text{first expression}$$

From the expression above, it can be considered that the quality factor Q is a ratio between the impedance component and the resistance component, and in order to raise the quality factor Q, it is a matter of course that the inductance value L must be raised as high as possible, and besides the resistance component, that is, the parasitic resistance of the spiral wiring, must be reduced.

Figure 3:
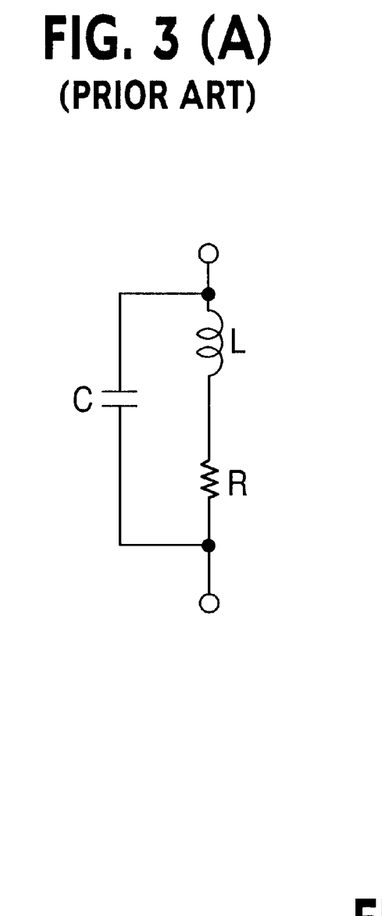
FIG. 3(A) is an equivalent circuit diagram of the inductor element and FIG. 3(B) is a voltage vector diagram.

An equivalent circuit of the inductor is shown in FIG. 3(A), and a vector diagram corresponding to the equivalent circuit is shown in FIG. 3(B). It can be seen from FIG. 3(B) that, since $\tan\delta$ increases and a displacement in phase between the voltages at the opposite ends of the inductance element increases as the resistance component increases, also from this point, it can be said that reduction of parasitic resistance R is important for improvement in performance of the inductor element. It is to be noted that $\tan\delta$ is a reciprocal number to the quality factor Q and called dielectric loss or loss factor, and represents the loss of the inductor. Further, in FIGS. 3(A) and 3(B), reference character VL denotes a voltage by the inductance, VR a voltage by the resistance component, L an inductance, R a parasitic resistance, and C a distributed capacity.

The relationship between the voltage across the inductor element and the current is given by the following expression:

$$V=I\omega L\cdot \sin(\omega t+\delta) \qquad \text{second expression}$$

Ideally $\delta=0$ degrees, but if a parasitic resistance component is present, then a displacement in phase is produced by $\delta$.

In order to raise the quality factor Q of an inductor, principally the following two methods have been proposed. First, the value of the inductance L of the first expression above is raised. In other words, this method increases the wiring length of the inductor formed from a metal wiring layer extending in a spiral configuration substantially in a plane to increase the number of turns. With this method, however, the occupying area of the inductor increases in a limited area of an LSI chip, and for example, where it is desired to obtain an inductance value higher than 10 nH, if the number of turns is 3.5, then outer dimension a becomes approximately 0.6 mm as seen from FIG. 2, which makes a significant obstacle to high integration of other circuits. Further, if the wiring length is increased simply, wiring resistance Rm increases, resulting in drop of the quality factor Q on the contrary.

Second, the wiring resistance Rm of the denominator of the first expression above is reduced. In other words, the second method increases the thickness of a wiring film of the inductor shown in FIG. 1. However, if the wiring film thickness is increased, a suitable mask material having a high etching selection ratio (selectivity) upon formation of a wiring, particularly upon dry etching, becomes unavailable, and where the wiring material is aluminum, the wiring film thickness can be increased only up to approximately 2 to 3 microns. Accordingly, it is difficult to remarkably decrease the wiring resistance.

Figure 4:
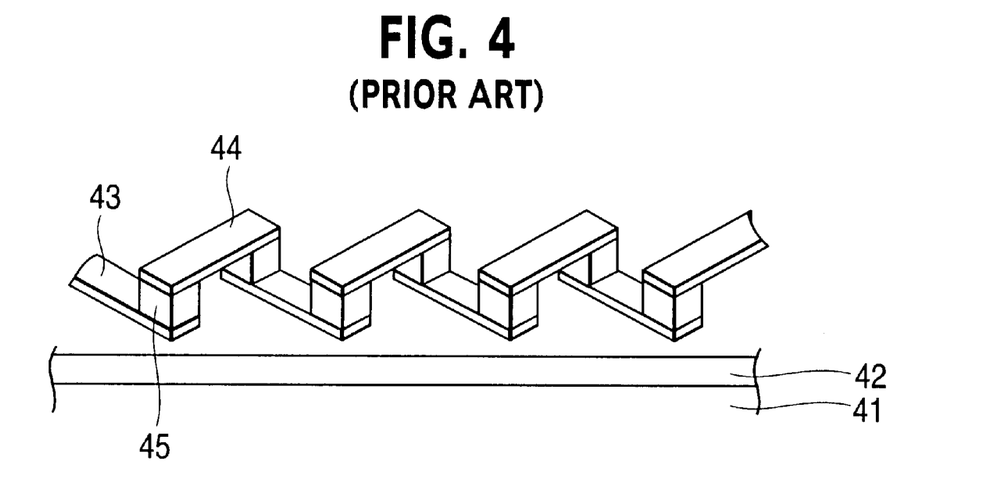
FIG. 4 is a schematic view showing an inductor element of the prior art.

Several proposals have been made to solve the disadvantages described above. For example, such an inductor element as shown in FIG. 4 is disclosed in Japanese Patent Laid-Open Application No. Showa 61-144052. Referring to FIG. 4, lower layer metal wiring layer 43 and upper layer metal wiring layer 44 are arranged alternately with inter-layer insulation film 42 interposed therebetween on insulation film 42 on a major face of semiconductor substrate 41, and end portions of each adjacent ones of them are connected to each other through a through-hole 45 formed by upper layer metal wiring layer 44, thereby constituting an inductor element which extends spirally in a horizontal direction.

Figure 5:
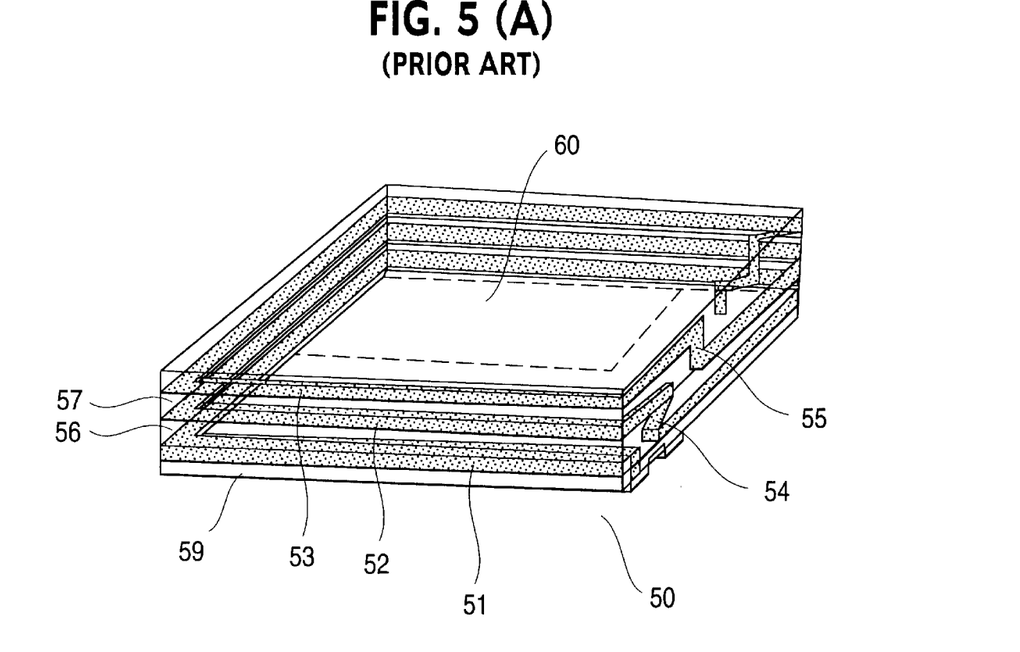

Meanwhile, in Japanese Patent Laid-Open Application No. Heisei 3-263366, such an inductor element as shown in FIG. 5 is disclosed. In particular, referring to FIG. 5(A), ring-shaped first layer metal wiring layer 51, ring-shaped second layer metal wiring layer 52 and ring-shaped third layer metal wiring layer 53 are placed one on another with inter-layer insulation films 56 and 57 interposed therebetween on insulation film 59 on circuit element region 60 of semiconductor substrate 50, and end portions of them are connected to each other through through-holes 54 and 55 formed in inter-layer insulation films 56 and 57, respectively, thereby to form an inductor element extending spirally in a vertical direction.

By forming patterns of metal wiring layers spirally in a plurality of layers through through-holes formed in inter-layer insulation films on an insulation film on a substrate making use of a multi-layer wiring technique to construct an inductor element in this manner, even if the wiring length is increased, the element occupying area does not exhibit a significant increase.

However, even if a structure with which a small occupying area of an element can be obtained is obtained making use of those methods, this merely increases the effective wiring length, and consequently, the wiring resistance Rm increases and the quality factor Q decreases on the contrary.

Further, in Japanese Patent Laid-Open Application No. Heisei 3-26336 mentioned above, in order to raise inductance value L, insulation films 56' and 57' having magnetic substance layer 58 interposed therebetween are disposed between each adjacent metal wiring layers. This arrangement, however, is disadvantageous in that the process of production requires a comparatively long time since a magnetic substance layer must be provided for each wiring layer and an insulation film must be provided between each adjacent wiring layer and magnetic substance layer. Further, though not recited in the document, a magnetic substance remains in wiring regions other than that in which the inductor element is formed, and this has a bad magnetic influence on some other circuit. On the other hand, in order to remove the magnetic substance layer in the wiring regions other than that in which the inductor element is formed, an etching step by photo-lithography must be added.

SUMMARY OF THE INVENTION

It is an object of the present invention to provide a semiconductor device including an inductor element of the spiral type wherein the value of the quality factor Q can be raised by reducing the wiring resistance.

It is another object of the present invention to provide a method of producing a semiconductor device by which an inductor element of the spiral type having an improved value of the quality factor Q can be obtained readily.

According to an aspect of the present invention, there is provided a semiconductor device, comprising an inductor element including a first conductive film pattern of a spiral configuration formed on a major face of a semiconductor substrate, and second conductive film patterns of an insular configuration electrically connected to the first conductive film pattern through contact holes formed in an inter-layer insulation film and extending in an overlapping relationship with the first conductive film pattern. Here, the second conductive film patterns may be patterns of a lower layer while the first conductive film pattern is a pattern of an upper layer. Or conversely, the first conductive film pattern may be a pattern of an upper layer while the second conductive film patterns are patterns of an upper layer. Preferably, a lead wiring formed from a same layer as that of the second conductive film patterns and electrically isolated from the second conductive film patterns is connected to a central portion of the first conductive film pattern. Further, the semiconductor device may be constructed such that the second conductive film patterns are patterns of an upper layer positioned away from the semiconductor substrate with respect to the first conductive film pattern, and a trimming conductive film formed from a same layer as that of the second conductive film patterns and electrically isolated from the second conductive film patterns is connected to a plurality of locations of the first conductive film pattern such that an inductance value of the inductor element is adjusted by selecting connection or disconnection of portions of the trimming conductive film at the plurality of locations. Further, side walls of a magnetic substance layer may be formed on side faces of the first conductive film pattern of the spiral configuration with insulation films interposed therebetween. In this instance, preferably the magnetic substance layer is an iron-nickel alloy layer or an iron-nickel-cobalt alloy layer. Further, preferably a spiral groove having a planar configuration similar to that of the first conductive film pattern is formed in the semiconductor substrate under the first conductive film pattern and is filled with an insulation film.

According to another aspect of the present invention, there is provided a method of producing a semiconductor device, comprising the steps of forming a groove of a spiral planar configuration on a major face of a semiconductor substrate and filling the groove with an insulation film to provide a separation groove region, thereby to form, on the separation groove region, an inductor element including a first conductive film pattern of a spiral configuration and second conductive film patterns of an insular configuration electrically connected only to the first conductive film pattern through contact holes formed in an inter-layer insulation film and extending in an overlapping relationship with the first conductive film pattern. Here, the second conductive film patterns of the insular configuration may be conductive film patterns of a lower layer formed on the separation groove region, and the first conductive film pattern of the spiral configuration may be a conductive film pattern of an upper layer provided on the second conductive film patterns with the inter-layer insulation film interposed therebetween. Or, the first conductive film pattern of the spiral configuration may be a conductive film pattern of a lower layer formed on the separation groove region, and the second conductive film pattern of the insular configuration may be conductive film patterns of an upper layer provided on the first conductive film pattern with the inter-layer insulation film interposed therebetween.

According to a further aspect of the present invention, there is provided a method of producing a semiconductor device, comprising the steps of forming lower layer conductive film patterns of an insular configuration on a semiconductor substrate, forming an inter-layer insulation film, forming contact holes extending to the lower layer conductive film patterns in the inter-layer insulation film, forming an upper layer conductive film pattern of a spiral configuration connected to the lower layer conductive film patterns through the contact holes, and forming side walls of a ferromagnetic substance on side walls of the upper layer conductive film pattern with insulation films interposed therebetween, thereby forming an inductor element.

The above and other objects, features, and advantages of the present invention will become apparent from the following description referring to the accompanying drawings which illustrate an example of a preferred embodiment of the present invention.

BRIEF DESCRIPTION OF THE DRAWINGS

FIGS. 3(A) and 3(B) illustrate a relationship between a parasitic resistance of an inductor element and the loss, and wherein

FIG. 5(A) and (B) is a schematic view showing another inductor element of the prior art;

FIGS. 6(A) and 6(B) show a first embodiment of the present invention, and wherein

FIGS. 7(A) and 7(B) show a second embodiment of the present invention, and wherein

FIGS. 9(A) and 9(B) show a third embodiment of the present invention, and wherein

FIGS. 11(A) and 11(B) show a fourth embodiment of the present invention, and wherein

DETAILED DESCRIPTION OF THE PREFERRED EMBODIMENTS

The present invention is described below with reference to the drawings.

Figure 6:
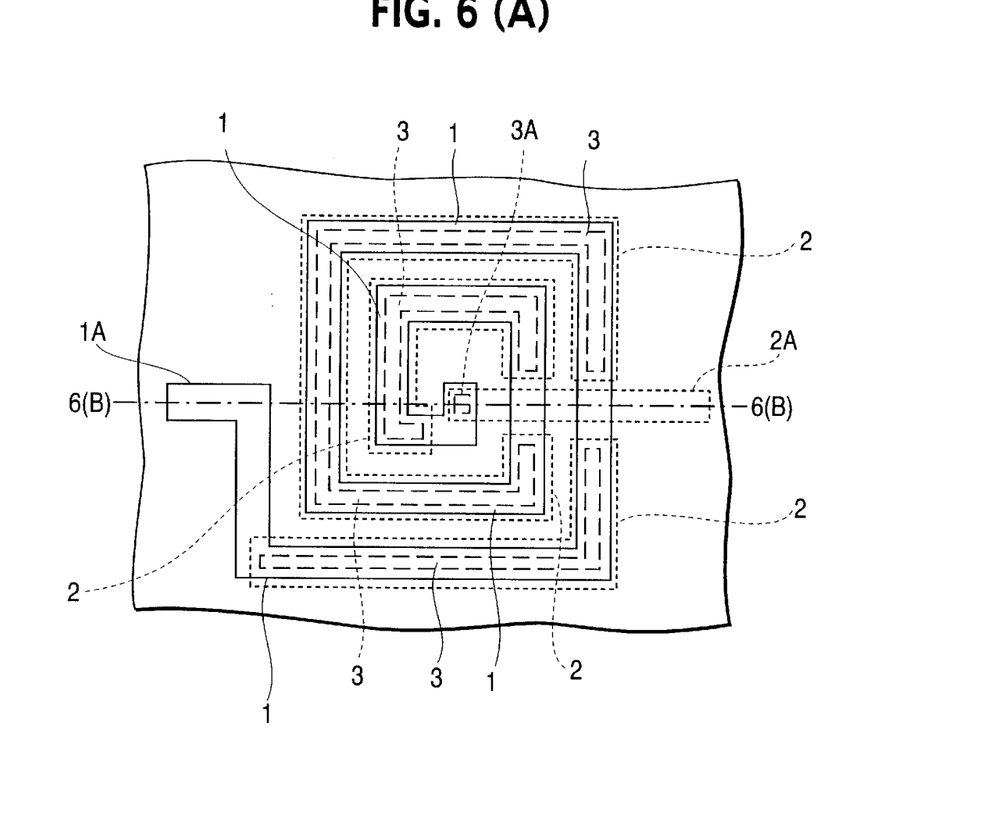
FIG. 6(A) is a plan view and FIG. 6(B) is a sectional view taken along line 6(B)—6(B) of FIG. 6(A)

A first embodiment of the present invention is described first. FIGS. 6(A) and 6(B) show an essential part of the first embodiment of the present invention, wherein FIG. 6(A) is a plan view and FIG. 6(B) is a sectional view taken along line 6(B)—6(B) of FIG. 6(A), Insulation film 101 is provided on semiconductor substrate 100. Second conductive film patterns 2 in the form of a metal layer are formed on insulation film 101. Inter-layer insulation film 102 is formed on them. Contact holes 3 having elongated planar configurations and lead contact hole 3A are formed in inter-layer insulation film 102. First conductive film pattern 1 in the form of a metal layer having a spiral planar configuration is formed on inter-layer insulation film 102. This first conductive film pattern 1 is connected to second conductive film patterns 2 through contact holes 3. A spiral inductor element is composed of first and second conductive film patterns 1 and 2 described above. Second conductive film patterns 2 isolated from one another are electrically connected only to first conductive film pattern 1 of the spiral configuration. Further, one lead wiring 1A for the inductor element is formed continuously to first conductive film pattern 1 while the other lead wiring 2A of the inductor element is formed continuously to second conductive film patterns 2.

Contact holes 3 extend along and are formed under first conductive film pattern 1. Second conductive film patterns 2 are isolated patterns, that is, insular patterns, electrically connected only to first conductive film pattern 1. And, second conductive film patterns 2 are located just below first conductive film pattern 1 and connected to first conductive film pattern 1 through contact holes 3 and extend along first conductive film pattern 1.

Lead wiring 2A formed from a metal layer of a lower layer similarly to second conductive film patterns 2 is connected to an end portion of first conductive film pattern 1 positioned at a central location of the spiral configuration and is led out to the outside of the spiral inductor element in such a manner that it does not contact second conductive film patterns 2. In particular, as seen from FIG. 6(A), second conductive film patterns 2 and contact holes 3 are formed spaced away from lead wiring 2A and neighboring portions of lead wiring 2A so that second conductive film patterns 2 and lead wiring 2A may not be electrically short-circuited to each other.

It is to be noted that, in the plan view of FIG. 6(A), second conductive film patterns 2, lead wiring 2A and contact holes 3 and 3A of the lower layer are indicated by broken lines while first conductive film pattern 1 of the upper layer is indicated by solid lines. While, in the present embodiment, first conductive film pattern 1 and second conductive film patterns 2 extend with an equal width, in order to facilitate recognition, in the plan view of FIG. 6(A), second conductive film patterns 2 of the lower layer indicated by broken lines are shown with a greater width than first conductive film pattern 1 of the upper layer indicted by solid lines.

As seen from those figures, particularly from the plan view of FIG. 6(A), since second conductive film patterns 2 and contact holes 3 are formed under the substantially overall length of first conductive film pattern 1 of the spiral configuration except lead wiring 2A and the neighboring portions to lead wiring 2A, the arrangement substantially achieves increase in film thickness without increasing the effective length, and consequently, the resistance Rm of the inductor element can be reduced sufficiently. Further, since the layers are composed of the first and second conductive film patterns, there is no need of increasing the film thickness of each film, which facilitates patterning by etching or a like method.

Next, a method of producing the present embodiment is described. First, for example, silicon oxide film 101 is deposited as an insulation film to a film thickness of 500 to 700 nm on the surface of semiconductor substrate 100 such as a silicon substrate using a CVD method. Then, using a sputtering method, a metal layer of a lower layer is formed to a thickness of 500 nm to 1 $\mu$m using, for example, aluminum, and then, using a photo-etching method, second conductive film patterns 2 isolated from each other and lead wiring 2A are formed by patterning. Then, for example, silicon oxide film 102 is deposited as an inter-layer insulation film to a film thickness of 500 nm to 1 $\mu$m by a CVD method, and contact holes 3 and lead contact hole 3A are formed using a dry etching method. Thereafter, a metal layer of the upper layer is formed to a thickness of 500 to 1 $\mu$m using, for example, aluminum, and using a photo-etching method, first conductive film pattern 1 of the spiral configuration and lead wiring 1A connected to first conductive film pattern 1 are formed by patterning.

As described above, in the present embodiment, the parasitic resistance Rm can be reduced by constructing the body of the spiral inductor element from first conductive film pattern 1 of the upper layer and backing (aluminum backing) second conductive film patterns 2 of the lower layer to the body of the spiral inductor element. Further, lead wiring 2A of the lower layer is used as a wiring for leading out one terminal of the inductor element from a central portion of the spiral wiring of first conductive film pattern 1. Furthermore, while contact holes 3 in FIG. 6(A) of the present embodiment have elongated configurations, each of them may be an array of a large number of square contact holes.

It is to be noted that naturally the aluminum layers which are metal layers of the upper layer and the lower layer composing first and second conductive film patterns 1 and 2 form, at other locations on the semiconductor substrate, wirings which interconnect circuit elements in the LSI other than the spiral inductor.

Figure 7:
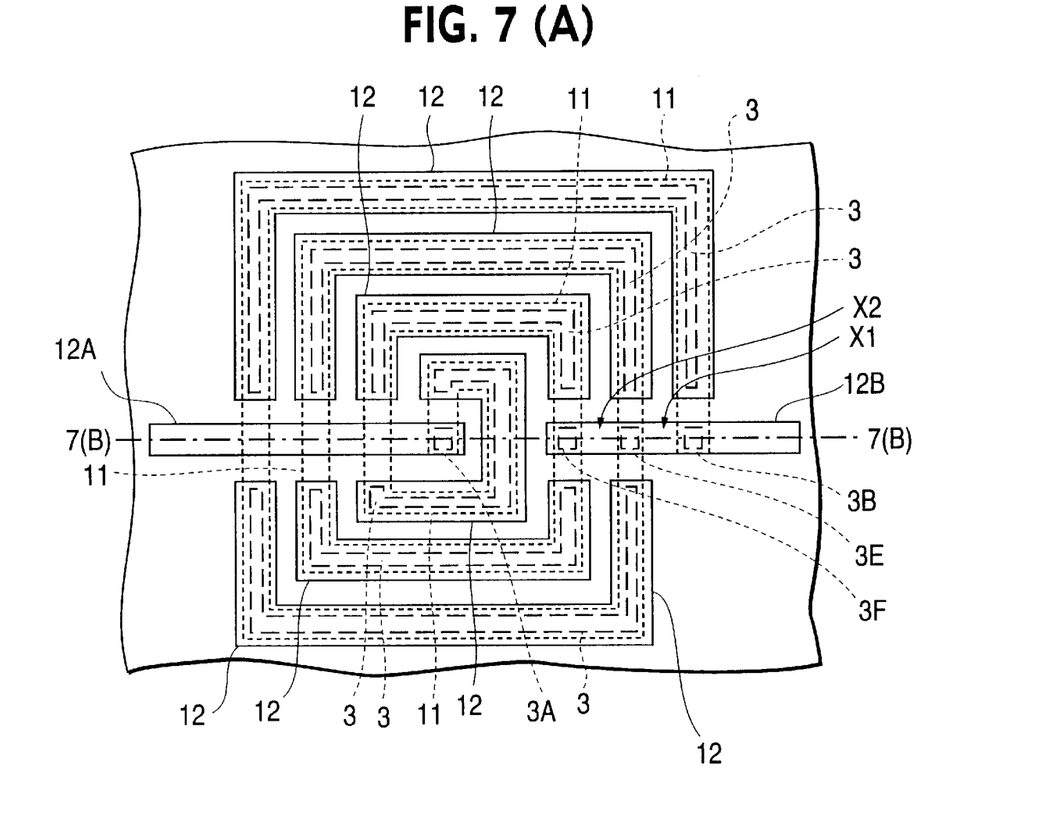
FIG. 7(A) is a plan view and FIG. 7(B) is a sectional view taken along line 7(B)—7(B) of FIG. 7(A)

A second embodiment of the present invention is described now. FIGS. 7(A) and 7(B) show an essential part of the second embodiment of the present invention, and wherein FIG. 7(A) is a plan view and FIG. 7(B) is a sectional view taken along line 7(B)—7(B) of FIG. 7(A). It is to be noted that, in FIGS. 7(A) and 7(B), same or similar elements are denoted by same reference characters to those of FIGS. 6(A) and 6(B) and overlapping description of them is omitted here.

In the present second embodiment, an inductor element can be realized which not only reduces the parasitic resistance of the inductor but also allows fine adjustment called trimming which is performed when a measured value of the inductance becomes displaced from a designed value therefor.

In the present second embodiment, conversely to the arrangement of the first embodiment, first conductive film pattern 11 of a spiral configuration which serves as the body of an inductor element is formed from a metal layer of a lower layer while second conductive film patterns 12 for backing isolated from one another so as to reduce the resistance are formed from a metal layer of the upper layer. And, contact holes 3 having elongated planar configurations are formed in inter-layer insulation film 102 over the substantially overall length of first conductive film pattern 11 along second conductive film patterns 12. Second conductive film patterns 12 isolated one from the other are electrically connected only to first conductive film pattern 11 of the spiral configuration through contact holes 3.

Further, from the metal layer of the upper layer, also one lead wiring 12A and trimming conductive film 12B which serves as the other lead wiring are formed.

The one lead wiring 12A extends through lead contact hole 3A and is connected to an end portion of first conductive film pattern 11 positioned at a central portion of the spiral configuration. Trimming conductive film 12B extends through lead contact holes 3B and is connected to an end portion of first conductive film pattern 11 positioned at an outermost peripheral portion of the spiral configuration, and serves as the other lead wiring. Further, trimming conductive film 12B extends through contact holes 3E and 3F and is connected to corresponding portions of first conductive film pattern 11.

After production of the inductor element is completed, a selected one of X1 and X2 portions of trimming conductive film 12B is cut using a laser beam to adjust the inductance of the inductor element so as to have a desired inductance value, that is, trimming is performed. For example, if it is desired to maximize the inductor length, both of the X1 and X2 portions are cut. But if it is desired to minimize the inductor length, none of the X1 and X2 portions is cut.

The one lead wiring 12A and trimming conductive film 12B which serves as the other lead wiring are led out to the outside of the spiral inductor element such that they do not contact with second conductive film patterns 12. In particular, as seen in FIG. 7(A), second conductive film patterns 12 and contact holes 3 are formed each in a U-shaped planar configuration in a spaced relationship away from lead wiring 12A and trimming conductive film 12B and neighboring portions of them so that second conductive film patterns 12 may not be electrically short-circuited to lead wiring 12A or trimming conductive film 12B and may be connected to first conductive film pattern 11 over a distance as long as possible.

It is to be noted that, in the plan view of FIG. 7(A), second conductive film patterns 12, lead wiring 12A and trimming conductive film 12B of the upper layer are indicated by solid lines while first conductive film pattern 11 of the lower layer and contact holes 3, 3A, 3B, 3E and 3F are indicated by broken lines. Further, while, also in the present embodiment, first conductive film pattern 11 and second conductive film patterns 12 extend with an equal width, in order to facilitate recognition, in the plan view of FIG. 7(A), second conductive film patterns 12 of the upper layer indicated by solid lines are shown with a greater width than first conductive film pattern 11 indicated by solid lines.

Here, if the quality factor Q described hereinabove in connection with the first expression is represented in more detail, the first expression can be represented also like the following third expression. The dependency of the quality factor Q upon the frequency f exhibits such a characteristic as seen in FIG. 8 where the line width W is 15 μm, the line distance is 5 μm and the outer dimension a is 300 μm.

$$1/Q = (Rm\omega L) + (\omega C sub/Rsub) \qquad \text{third}$$

expression where Rsub is the resistance of the substrate, and Csub is the parasitic capacitance between the inductance element and the substrate. From the third expression, it can be recognized that, in order to increase the quality factor Q, it is effective, in addition to reduction of the spiral wiring parasitic resistance Rm of the inductor, to decrease the parasitic capacitance Csub between the inductor element and the substrate and increase the resistance Rsub of the substrate.

Figure 8:
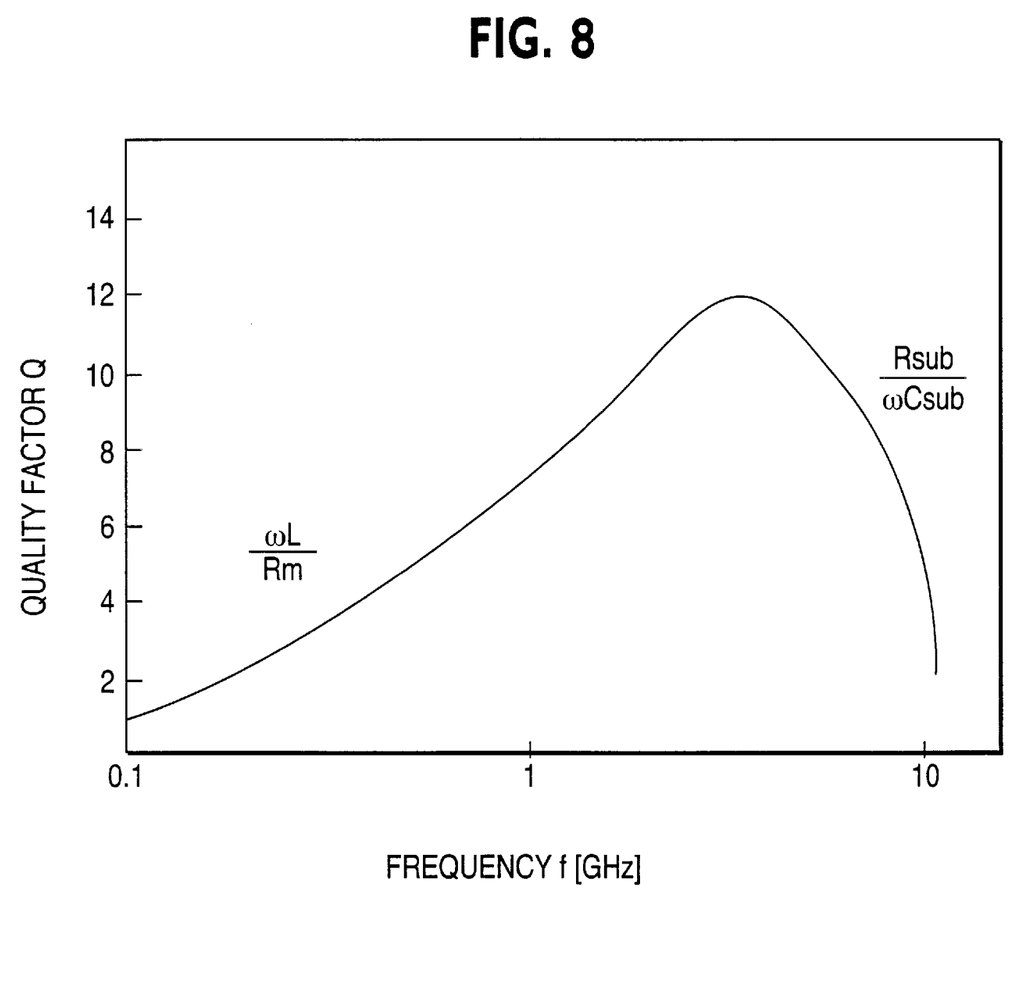
FIG. 8 is a diagram illustrating a frequency characteristic of the quality factor of an inductor element.

The relationship between the dependency of the quality factor Q upon the frequency f and the parasitic components is such as illustrated in FIG. 8. For example, in a frequency lower than 1 GHz, principally the wiring resistance has a significant influence, but in a frequency of 5 to 10 GHz or more, principally the factors of the parasitic capacitance Csub and the parasitic resistance Rsub have a significant influence.

Accordingly, where the frequency used is comparatively low (1 GHz), in order to realize a high quality factor Q, the first and second embodiments of the present invention are effective. On the other hand, in order to realize a high quality factor Q in a frequency of 5 to 10 GHz or more, it is effective to adapt third and fourth embodiments of the present invention described below. Naturally, the first to fourth embodiments may be adapted in a suitable combination.

Figure 9:
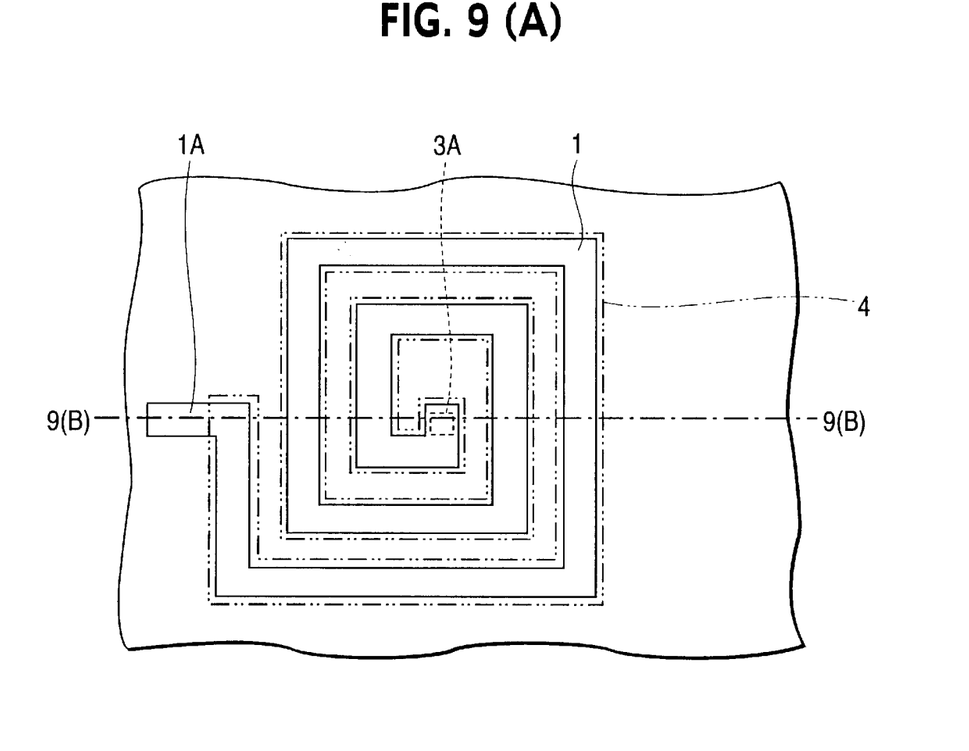
FIG. 9(A) is a plan view and FIG. 9(B) is a sectional view taken along line 9(B)—9(B) of FIG. 9(A)

The third embodiment of the present invention is described below. FIGS. 9(A) and 9(B) show an essential part of the third embodiment, wherein FIG. 9(A) is a plan view and FIG. 9(B) is a sectional view taken along line 9(B)—9(B) of FIG. 9(A). It is to be noted that, in FIGS. 9(A) and 9(B), same or similar elements are denoted by same reference characters to those of FIGS. 6(A) and 6(B), and therefore, overlapping description of them is omitted here.

In the plan view of FIG. 9(A), in order to facilitate recognition, only first conductive film pattern 1 of the spiral configuration and lead wiring 1A (solid lines) of the upper layer, lead contact hole 3A (broken line) at a central portion of the spiral configuration, and separation groove 4 (alternate long and two short dashes lines) of a spiral configuration under first conductive film pattern 1 of the spiral configuration are shown.

The present third embodiment is different from the first and second embodiments described above in that an insulating separation region in which separation groove 4 in which insulation film 103 is filled is formed is provided in a substrate just below first conductive film pattern 1 of the spiral configuration which serves as the body of an inductor element provided on an insulation film on the substrate.

With the present embodiment described above, the parasitic capacitance produced between the inductor element and the substrate can be reduced to a very low value by insulating separation region 4, 103 provided in the substrate.

A method of producing the present embodiment is described below with reference to the drawings.

Figure 10:
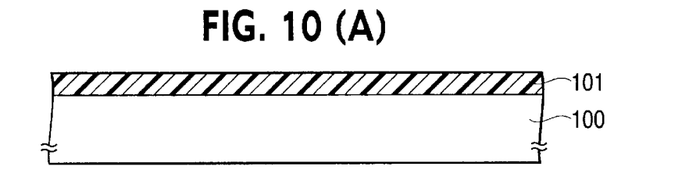
FIGS. 10(A) to 10(E) are sectional views illustrating a method of producing the third embodiment of the present invention in order of steps.

First, an insulation film such as, for example, silicon oxide film 101 is formed to a film thickness of 500 to 700 nm on semiconductor substrate 100 as seen in FIG. 10(A). Then, semiconductor substrate 100 and silicon oxide film 101 are dry etched to form separation groove 4 of, for example, 5 μm deep as seen in FIG. 10(B). Preferably, the width of separation groove 4 is equal to or greater by 1 to 2 μm than the width of an inductor wiring which is formed at a later step, that is, the width of the first conductive film pattern. Naturally, if an inductor wiring pattern, that is, the first conductive film pattern is wide, a plurality of separation grooves can be provided just under the first conductive film pattern.

Then, an insulation film, for example, silicon oxide film 103, is deposited to a thickness of 500 nm to 1 μm as seen in FIG. 10(C) by a CVD method. Silicon oxide film 103 is used as an inter-layer insulation film under second conductive film patterns 2 and lead wiring 2A of the lower layer metal layer and also as an insulation film for filling up the inside of separation groove 4. Thereafter, the surface of silicon oxide film 103 may be polished by a CMP (Chemical-Mechanical-Polishing) method to enhance the flatness of the surface. By the enhancement of the flatness, a spiral inductor can be realized with a high yield without suffering from disconnection of an inductor wiring layer even if the spiral inductor is formed on a groove separation region.

Then, similarly as in the first embodiment, second conductive film patterns 2 of the lower layer are provided just above separation groove 4 as seen in FIG. 10(D). Then, inter-layer insulation film 102 is formed as seen in FIG. 10(E), and contact holes 3 for allowing interconnection between first conductive film pattern 1 and second conductive film patterns 2 and lead contact hole 3A for allowing interconnection between first conductive film pattern 1 and lead wiring 2A are formed in inter-layer insulation film 102. Thereafter, first conductive film 1 of the spiral configuration which serves as the body of the spiral inductor element is formed just above separation groove 4.

It is described that, in FIGS. 9(A) and 9(B) and 10(A) to 10(E), the second conductive film patterns of the insular configuration are the conductive film patterns of the lower layer formed on separation groove region 4 while the first conductive film pattern of the spiral configuration is the conductive film pattern of the upper layer provided on the second conductive patterns with the inter-layer insulation film interposed therebetween. However, alternatively the first conductive film pattern of the spiral configuration may be the conductive film pattern of the lower layer formed on separation groove region 4 while the second conductive film patterns of the insular configuration may be the conductive film pattern of the upper layer provided on the first conductive film pattern with the inter-layer insulation film interposed therebetween. Also with the alternative arrangement, similar effects can be achieved.

It is to be noted that the reason why not one groove conforming to the outer profile of the inductor element is provided but separate groove regions are provided in the substrate just below the body of the inductor element along the inductor pattern of the spiral configuration is that it is intended to facilitate filling up of the inside of the separation groove with the insulation film. In particular, the outer profile of the inductor element normally has such a size of up to several hundreds μm square as described hereinabove, and it is very difficult to fill up over such a large area with a good flatness with an insulation film. Further, where the grooves provided under the inductor element and separation grooves for transistor elements used in the inside of a circuit provided in another region of the LSI are formed simultaneously, if a groove region of the spiral configuration is provided in the substrate under the inductance element as in the present embodiment, then the insides of the grooves can be filled up readily with an insulation film. Normally, the groove separation for bipolar transistors is provided with the width of 0.5 to 1.5 μm and the depth of 3 to 5 μm.

It is to be noted that, in order to obtain a high quality factor Q, it is important for a semiconductor substrate, in which a groove is to be formed, to have a resistance as high as possible (high Rsub) as seen from the third expression described above. Accordingly, for example, a substrate having a specific resistance of 10 to 100 ohm-cm is used.

Figure 11:
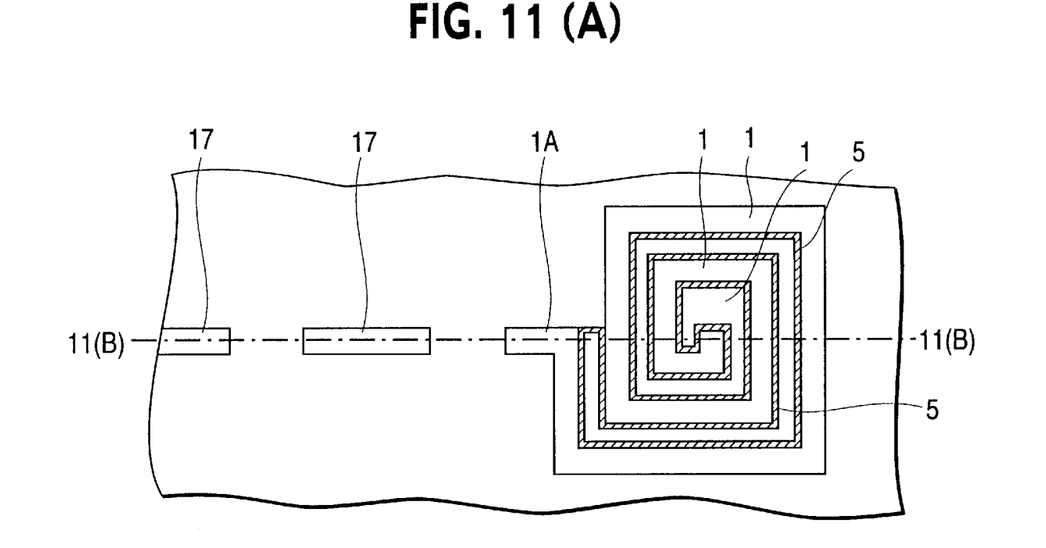
FIG. 11(A) is a plan view and FIG. 11(B) is a sectional view taken along line 11(B)—11(B) of FIG. 11(A)

Next, a fourth embodiment of the present invention is described. FIGS. 11(A) and 11(B) show an essential part of the fourth embodiment, and wherein FIG. 11(A) is a plan view and FIG. 11(B) is a sectional view taken along line 11(B)—11(B) of FIG. 11(A). It is to be noted that, in FIGS. 11(A) and 11(B), same or similar elements are denoted by same reference characters to those of FIGS. 6(A) and 6(B), and therefore, overlapping description of them is omitted here.

The present fourth embodiment is different from the first to third embodiments in that a spiral inductor provided on an insulation film on a substrate has side walls of a magnetic substance layer on side faces of first conductive film pattern 1 of the spiral configuration of the upper layer which is the body of the inductor element with insulation films interposed therebetween.

With the present embodiment, even where wirings are formed in multiple layers such as 3 to 4 layers, there is no need of providing a magnetic substance layer between each adjacent ones of the wiring layers, and the inductance value can be made higher simply comparing with that achieved by a conventional method of production.

It is to be noted that, in the plan view of FIG. 11(A), in order to facilitate recognition, only first conductive film pattern 1, lead wiring 1A and magnetic substance side walls 5 formed from the metal layer of the upper layer are shown.

Further, on the left side in FIGS. 11(A) and 11(B), lower layer wirings 16 obtained, upon formation of mutually isolated second conductive film patterns 2 of the inductor element, by patterning of the metal layer of the same lower layer and upper layer wirings 17 obtained, upon formation of first conductive film pattern 1 of the spiral configuration of the inductor element, by patterning of the metal layer of the same upper layer are formed. And, upper layer wirings 17 and lower layer wirings 16 are connected to each other through through-holes 18 formed at the same step as that of formation of contact holes 3 of the inductor element. Thus, a multi-layer wiring structure for the other internal circuits of the semiconductor substrate is constructed from them. Further, insulation films, for example, silicon oxide films 104 and 105, are provided on first conductive film pattern 1 of the inductor element and upper layer wirings 17 of the multi-layer wiring structure, respectively, and silicon oxide film 105 is applied to side faces of first conductive film pattern 1 of the spiral configuration of the inductor element and side walls 5 of a magnetic substance layer are formed on silicon oxide film 105.

In the following, a method of producing the present fourth embodiment is described with reference to FIGS. 12(A) to 12(C), 13(A) and 13(B).

Figure 12:
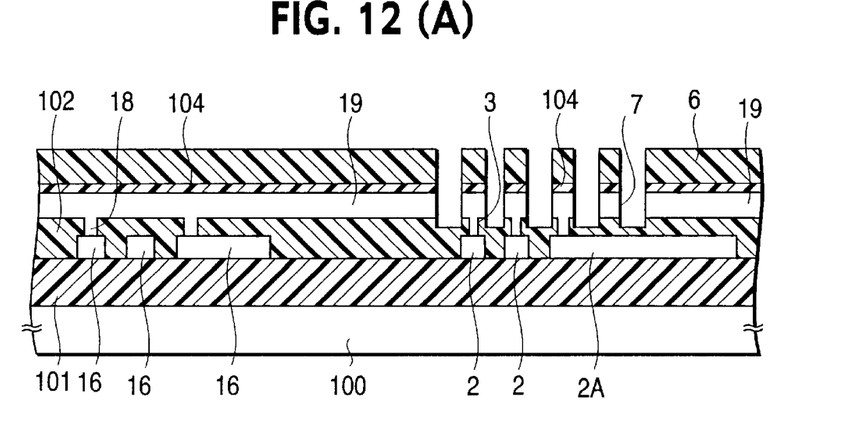
FIGS. 12(A) to 12(C) and 13(A) and 13(B) are sectional views illustrating a method of producing the fourth embodiment of the present invention in order of steps.
Figure 14:
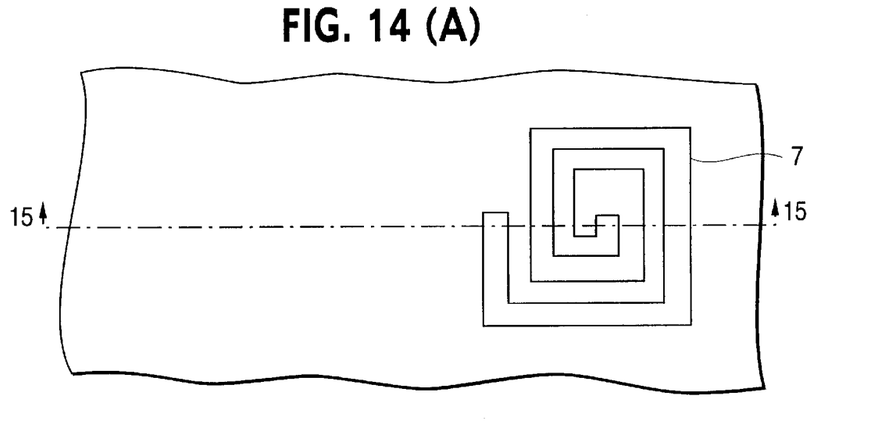
FIGS. 14(A) and 14(B) are plan views in different steps of the method of producing the fourth embodiment of the present invention, and wherein section 15—15 of FIG. 14(A) is the sectional view of FIG. 7(A) and section 15—15 of FIG. 14(B) is the sectional view of FIG. 8(A)

Similarly as in the first embodiment described hereinabove, an insulation film, for example, silicon oxide film 101, is formed to a film thickness of 500 to 700 nm on semiconductor substrate 100 as seen in FIG. 12(A). Then, a lower layer metal layer is deposited and patterned to form mutually isolated second conductive film patterns 2 and lead wiring 2A of the spiral inductor element and lower layer wirings 16 for the other internal circuits. Then, an insulation film, for example, silicon oxide film 102, is formed to a film thickness of 500 to 600 nm by a low temperature CVD method of a growth temperature of 200° to 400° C., and then, contact holes 3, 3A and 18 are formed. Thereafter, upper layer metal layer 19 and an insulation film, for example, silicon oxide film 104, are formed to a film thickness of 200 to 300 nm. Silicon oxide film 104 on upper layer metal layer 19 is provided to facilitate etching of upper layer metal layer 19 and need not necessarily be provided. Then, using a photo-etching method, silicon oxide film 104 and upper layer metal layer 19 are selectively etched using photo-resist 6 as a mask to form space groove 7 for an inductor element. If, upon this etching, also inter-layer insulation film 102 below is over etched by 100 to 200 nm, then magnetic substance side walls to be formed in a following step can be formed on and cover over the side faces of first conductive film pattern 1 of the spiral configuration sufficiently and readily. Through the steps described above, a structure shown in the sectional view of FIG. 12(A) is obtained. Further, a plan view only of space groove 7 in this instance is shown in FIG. 14(A), and a sectional view taken along line 15—15 of FIG. 14(A) is FIG. 12(A).

Then, photo-resist 6 is removed, and an insulation film, for example, silicon oxide film 105, is grown to a film thickness of 50 to 100 nm on the entire area of the substrate as seen in FIG. 12(B) by a low temperature CVD method at a growth temperature of 200 to 450° C. Then, using a vapor deposition method, a magnetic substance layer, for example, alloy layer 9 of an iron-nickel (Fe·Ni) alloy is formed.

Then, horizontal portions of magnetic substance alloy layer 9 are removed as seen in FIG. 12(C) by an ion milling method while leaving only vertical portions to form side walls 5 of the magnetic substance layer obtained from magnetic substance alloy layer 9 are formed on the side faces of first conductive film pattern 1 of the spiral configuration. The milling conditions are: for example, an acceleration voltage of 400 to 500 V and an acceleration current of 0.4 to 0.5 A.

Figure 13:
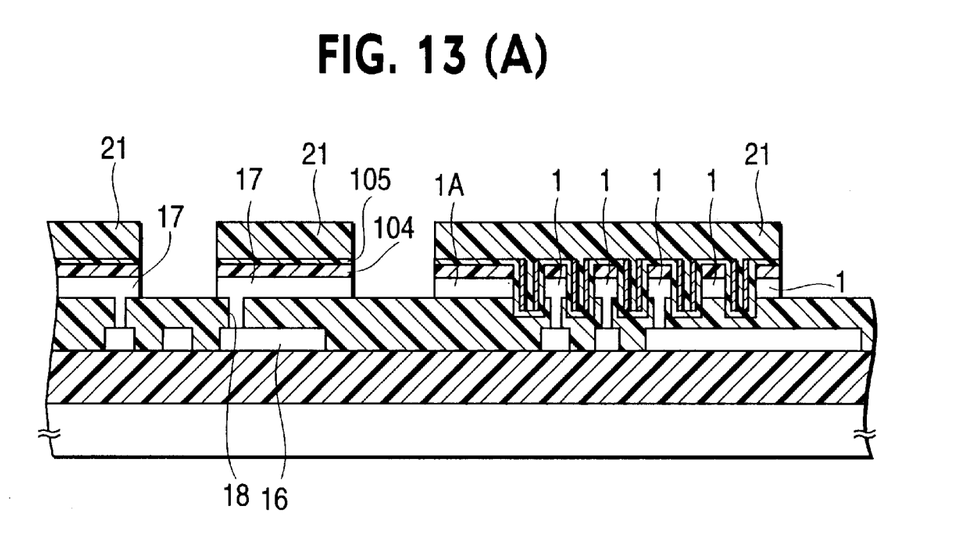

Then, the upper layer metal layer on the outer periphery of the spiral inductor element and upper layer metal layer 19 used for the circuits other than the inductor element are patterned as seen in FIG. 13(A) using etching mask 21. A plan view in this instance is shown in FIG. 14(B), and a sectional view taken along line 15—15 of FIG. 14(B) is FIG. 13(A).

Thereafter, etching mask 21 is removed, thereby to obtain a structure shown in the sectional view of FIG. 13(B).

In the present embodiment, since upper layer wirings 17 are formed after the side walls of the magnetic substance are formed in the inductor space groove, when the magnetic substance side walls are formed using ion milling, such a trouble that upper layer wirings 17 are short-circuited to each other by a scattered piece of the magnetic substance does not occur.

Figure 15:
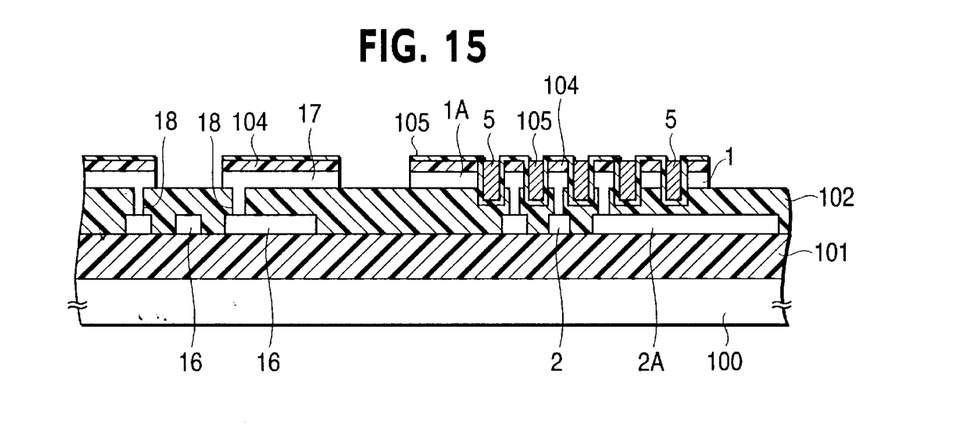
FIG. 15 is a sectional view showing a form wherein the fourth embodiment of the present invention is partially modified.

Further, the space between the first conductive films of the spiral configuration of the spiral inductor element may otherwise be filled up fully with magnetic substance layer 5 as seen in FIG. 15.

Further, while ferrite (a mixture of iron oxides and calcium oxide) which has conventionally been used for a magnetic substance layer is inferior in frequency characteristic and a magnetic substance layer of ferrite can be used only with a frequency of up to the kHz order, an iron-nickel alloy has a superior frequency characteristic and a magnetic substance layer of the alloy can be used for a region of several MHz to several tens MHz. Further, cobalt may be mixed into a magnetic substance layer to form an alloy layer of iron-nickel-cobalt (Fe·Ni·Co). The iron-nickel-cobalt alloy is higher in frequency characteristic than the iron-nickel alloy and can be used for a radio frequency of several hundreds MHz or more.

Further, the silicon oxide films as insulation films 101, 102, 103, 104 and 105 employed in the first to fourth embodiments described above preferably contain no impurity such as phosphor in order to eliminate an influence of depolarization or a like phenomenon. Further, the material of those insulation films is not limited to silicon oxide films, and some other insulation materials such as silicon nitride films may be employed or those insulation materials may be combined suitably to construct insulation films.

As described above, by employing the structures of the first and second embodiments of the present invention, the parasitic resistance Rm of a spiral inductor element can be reduced remarkably.

Further, by applying the third embodiment to form a separation groove region, in which an insulation film is filled, in a substrate just below a first conductive film pattern of a spiral configuration of an inductor element, the parasitic capacitance produced between the inductor element and the substrate can be reduced to a very low value while the quality factor Q of the inductor element can be raised high.

Further, with the fourth embodiment, a magnetic substance layer can be provided between wiring layers of a spiral inductor element more readily than by methods of production proposed conventionally, and the value of the quality factor Q of the inductor can be further raised and a good high frequency characteristic can be obtained.

It is to be understood that variations and modifications of a semiconductor device and a method of producing the same disclosed herein will be evident to those skilled in the art. It is intended that all such modifications and variations be included within the scope of the appended claims.

What is claimed is:

1. A semiconductor device, comprising:
   an inductor element formed on a semiconductor substrate and including a first conductive film of a spiral configuration, and a second conductive film of an insular configuration.
   wherein the insular configuration of said second conductive film includes a plurality of conductive elements that are electrically isolated from one another but are electrically connected to said first conductive film respectively through a plurality of contacts formed in an inter-layer insulation film disposed between the first and second conductive films.

2. A semiconductor device as claimed in claim 1, wherein said second conductive film is disposed between said semiconductor substrate and said first conductive film.

3. A semiconductor device as claimed in claim 1, wherein said first conductive film is disposed between said semiconductor substrate and said second conductive film.

4. A semiconductor device as claimed in claim 3, further comprising a trimming conductive film formed on a same layer as that of said second conductive film, electrically isolated from the conductive elements of said second conductive film, and electrically connected to said first conductive film to a plurality of portions of said trimming conductive film, wherein an inductance value of said inductor element can be adjusted by electrically isolating one or more of said portions of said trimming conductive film from one another.

5. A semiconductor device as claimed in claim 1, wherein a lead wiring formed on a same layer as that of said second conductive film and electrically isolated from the conductive elements of said second conductive film is connected to said first conductive film.

6. A semiconductor device as claimed in claim 1, wherein side walls of a magnetic substance layer are formed on side faces of said first conductive film of the spiral configuration with insulation films interposed therebetween.

7. A semiconductor device as claimed in claim 6, wherein said magnetic substance layer comprises an iron-nickel alloy layer or an iron-nickel-cobalt alloy layer.

8. A semiconductor device as claimed in claim 1, wherein a spiral groove having a planar configuration similar to that of said first conductive film is formed in said semiconductor substrate under said first conductive film and is filled with an insulation film.

9. A semiconductor device as claimed in claim 1, wherein a plurality of grooves are provided along said first conductive film in said semiconductor substrate under said first conductive film and are filled with an insulation film.

10. A semiconductor device as claimed in claim 1, wherein the first conductive film forms a single contiguous conductive path.

11. A semiconductor device as claimed in claim 10, wherein the second conductive film also has a spiral configuration but is non-contiguous.

12. A semiconductor device comprising:
    a semiconductor substrate;
    an inductor element formed on the semiconductor substrate and including a first conductive film and a second conductive film; and
    an insulation layer disposed between the first and second conductive films,
    wherein the first conductive film has a spiral configuration and the second conductive film has a plurality of conductive elements that are electrically isolated from one another but are electrically connected to the first conductive film respectively through a plurality of contacts formed in the insulator layer.

13. A semiconductor device as claimed in claim 12, wherein the contacts and the conductive elements of the second conductive film have the same planar configuration.

14. A semiconductor device as claimed in claim 13, wherein the first conductive film is above the second conductive film.

15. A semiconductor device as claimed in claim 13, wherein the first conductive film is below the second conductive film.

16. A semiconductor device as claimed in claim 12, further comprising a trimming conductive film formed on a same layer as that of said second conductive film, electrically isolated from the conductive elements of said second conductive film, and electrically connected to said first conductive film at a plurality of portions of said trimming conductive film, wherein an inductance value of said inductor element can be adjusted by electrically isolating one or more of said portions of said trimming conductive film from one another.

17. A semiconductor device as claimed in claim 12, further comprising a lead wiring formed on a same level as that of the second conductive film, electrically isolated from the conductive elements of the second conductive film, and electrically connected to the first conductive film.

18. A semiconductor device as claimed in claim 17, wherein the lead wiring extends from a central location of the second conductive film and extends outwardly therefrom between the conductive elements of the second conductive film.

19. A semiconductor device as claimed in claim 12, wherein side walls of a magnetic substance layer are formed on side faces of said first conductive film with insulation films interposed therebetween.

20. A semiconductor device as claimed in claim 12, wherein a magnetic substance layer is formed to fill in gaps between side faces of said first conductive film.

21. A semiconductor device as claimed in claim 12, wherein a spiral groove having a planar configuration similar to that of said first conductive film is formed in said semiconductor substrate under said first conductive film and is filled with an insulation film.

22. A semiconductor device as claimed in claim 12, wherein a plurality of grooves are provided along said first conductive film in said semiconductor substrate under said first conductive film and are filled with an insulation film.

23. A semiconductor device as claimed in claim 12, wherein the first conductive film forms a single contiguous conductive path.

24. A semiconductor device as claimed in claim 23, wherein the second conductive film also has a spiral configuration but is non-contiguous.

25. A semiconductor device comprising:
    a semiconductor substrate;
    an inductor element formed on the semiconductor substrate and including a first conductive film of a contiguous spiral configuration and a second conductive film of a non-contiguous spiral configuration; and
    an insulation layer disposed between the first and second conductive films,
    wherein non-contiguous elements of the second conductive film are electrically connected to the first conductive film respectively through a plurality of contacts formed in the insulator layer.

26. A semiconductor device as claimed in claim 25, wherein the first conductive film is below and substantially underlies the second conductive film.

27. A semiconductor device as claimed in claim 25, wherein the second conductive film is below and substantially underlies the film conductive film.

* * * * *